(12) United States Patent
Tokioka

(10) Patent No.: US 6,583,746 B2
(45) Date of Patent: Jun. 24, 2003

(54) A/D CONVERTER WITH HIGH SPEED INPUT CIRCUIT

(75) Inventor: Yoshinori Tokioka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/141,115

(22) Filed: May 9, 2002

(65) Prior Publication Data

US 2003/0095061 A1 May 22, 2003

(30) Foreign Application Priority Data

Nov. 16, 2001 (JP) ........................................ 2001-351862

(51) Int. Cl.[7] .............................................. H03M 1/12
(52) U.S. Cl. ........................................ 341/155; 341/142
(58) Field of Search ................................. 341/155, 118, 341/167, 166, 142; 348/695; 327/541

(56) References Cited

U.S. PATENT DOCUMENTS 5,194,868 A * 3/1993 Bahng et al. ................ 341/167
5,341,218 A * 8/1994 Kaneko et al. .............. 348/695
6,141,455 A * 10/2000 Matsuzawa et al. ........ 382/250
6,225,934 B1 * 5/2001 Ohashi et al. ............... 341/155
6,417,725 B1 * 7/2002 Aram et al. ................. 327/541

* cited by examiner

Primary Examiner—Jean Bruner Jeanglaude
(74) Attorney, Agent, or Firm—Burns, Doane, Swecker & Mathis, LLP

(57) ABSTRACT

An A/D converter includes a first DC bias circuit and a second DC bias circuit with the same configuration and characteristic, the first and second DC bias circuits generate first and second common voltages with the same voltage level independently in response to a feedback control voltage supplied from an operational amplifier. The operational amplifier controls the first and second DC bias circuits in such a manner that the second common voltage fed from the second DC bias circuit via a second input buffer matches to the common voltage of the reference voltages of an AD core. This enables the first common voltage, which is generated by the first bias circuit and superimposed onto the analog input signal through the first input buffer, to be matched to the common voltage of the reference voltages of the A/D core.

7 Claims, 3 Drawing Sheets

A/D CONVERTER WITH HIGH SPEED INPUT CIRCUIT

BACKGROUND OF THE INVENTION

1. Field of the Invention

The present invention relates to an A/D converter that matches the common voltage of an analog input signal to the common voltage of reference voltages.

2. Description of Related Art

FIG. 5 is a circuit diagram showing a conventional A/D converter. In this figure, the reference numeral 1 designates an input buffer for temporarily holding an analog input signal; and 2 designates an A/D core for generating a plurality of reference voltages, and for converting the analog input signal supplied via the input buffer 1 into a digital output signal on the basis of the reference voltages.

Next, the operation of the conventional A/D converter will be described.

In FIG. 5, the input buffer 1 temporarily holds the analog input signal. The A/D core 2 generates the reference voltages corresponding to the number of bits of the digital conversion. For example, for the 2-bit digital conversion, it generates $2^2=4$ types of voltages such as 1, 2, 4 and 8 V, and converts the analog input signal supplied via the input buffer 1 to the digital output signal on the basis of the reference voltages.

Here, the analog input signal usually includes a DC (direct current) component, which is called a common voltage of the analog input signal.

An intermediate voltage between the plurality of reference voltages generated by the A/D core 2 is called a common voltage of the reference voltages. For example, as for the A/D core for the 2-bit digital conversion, the average of the intermediate reference voltages (2 and 4 V) of the four types of the reference voltages (1, 2, 4 and 8 V), that is, 3 V, is called the common voltage of the reference voltages.

To achieve precise digital conversion of the analog input signal, it is necessary for the A/D converter to match the common voltage of the analog input signal to the common voltage of the reference voltages.

The conventional A/D converter as shown in FIG. 5 comprises a common mode feedback circuit in the input buffer 1 in order to match the common voltage of the analog input signal to the common voltage of the reference voltages.

The common mode feedback circuit comprises a voltage generator and an operational amplifier. The voltage generator generates a voltage nearly equal to the common voltage of the reference voltages. The operational amplifier compares the voltage generated by the voltage generator with the output voltage of the input buffer 1, which is fed back. Thus, the common mode feedback circuit controls in such a fashion that the output voltage of the input buffer 1 agrees with the voltage generated by the voltage generator, that is, the common voltage of the analog input signal supplied to the A/D core 2 agrees with the common voltage of the reference voltages generated by the A/D core 2.

With the foregoing configuration that comprises the common mode feedback circuit in the input buffer 1, the conventional A/D converter matches the common voltage of the analog input signal supplied to the A/D core 2 to the common voltage of the reference voltages generated in the A/D core 2, thereby enabling the analog input signal to undergo precise digital conversion.

High-speed A/D converters required recently, however, must have fast input buffers. Therefore, it is very difficult to fabricate complicated conventional input buffers including the common mode feedback circuit with the operational amplifier for handling the analog input signal.

SUMMARY OF THE INVENTION

The present invention is implemented to solve the foregoing problem. It is therefore an object of the present invention to provide a high-speed A/D converter with a simple configuration.

According to a first aspect of the present invention, there is provided an A/D converter comprising: a capacitor for removing a DC component of an analog input signal; a first DC voltage generator for generating a DC voltage controlled in response to a feedback control voltage, and for applying the DC voltage to the analog input signal passing through the capacitor; a first input buffer for temporarily holding the analog input signal passing through the first DC voltage generator; an A/D core that generates a plurality of reference voltages and an intermediate voltage of the reference voltages, and that converts the analog input signal passing through the first input buffer into a digital output signal on the basis of the reference voltages; a second DC voltage generator for generating, in response to the feedback control voltage, a same DC voltage as the DC voltage the first DC voltage generator generates; a second input buffer consisting of a replica of the first input buffer, for temporarily holding the DC voltage the second DC voltage generator generates; and an operational amplifier for supplying the feedback control voltage to the first DC voltage generator and the second DC voltage generator to match the DC voltage passing through the second input buffer to the intermediate voltage of the reference voltages the A/D core generates.

Here, the first DC voltage generator may comprise a first conductivity type transistor and a resistor, which are connected in series between a power supply and a ground, and the first input buffer may be connected to a connecting point of the first conductivity type transistor and the resistor; the second DC voltage generator may comprise a first conductivity type transistor and a resistor, which are connected in series between the power supply and the ground, and the second input buffer may be connected to a connecting point of the first conductivity type transistor and the resistor; and the first conductivity type transistors may have their gates supplied with the feedback control voltage.

The first DC voltage generator may comprise a resistor and a second conductivity type transistor, which are connected in series between a power supply and a ground, and the first input buffer may be connected to a connecting point of the resistor and the second conductivity type transistor; the second DC voltage generator may comprise a resistor and a second conductivity type transistor, which are connected in series between the power supply and the ground, and the second input buffer may be connected to a connecting point of the resistor and the second conductivity type transistor; and the second conductivity type transistors may have their gates supplied with the feedback control voltage.

The second input buffer may consist of a downsized replica of the first input buffer.

The A/D converter may further comprise a low-pass filter connected to an output terminal of the operational amplifier, for filtering the feedback control voltage.

According to a second aspect of the present invention, there is provided an A/D converter comprising: a first capacitor for removing a DC component of a first analog input signal; a first DC voltage generator for generating a DC voltage controlled in response to a feedback control voltage, and for applying the DC voltage to the first analog input signal passing through the first capacitor; a first input buffer for temporarily holding the first analog input signal passing through the first DC voltage generator; a second capacitor for removing a DC component of a second analog input signal; a second DC voltage generator for generating a DC voltage controlled in response to a feedback control voltage, and for applying the DC voltage to the second analog input signal passing through the second capacitor; a second input buffer for temporarily holding the second analog input signal passing through the second DC voltage generator; an A/D core that generates a plurality of reference voltages and an intermediate voltage of the reference voltages, and that converts a differential input between the first analog input signal passing through the first input buffer and the second analog input signal passing through the second input buffer into a digital output signal on the basis of the reference voltages; a third DC voltage generator for generating, in response to the feedback control voltage, a same DC voltage as the DC voltages the first DC voltage generator and the second DC voltage generator generate; a third input buffer consisting of a replica of the first input buffer and the second input buffer, for temporarily holding the DC voltage the third DC voltage generator generates; and an operational amplifier for supplying the feedback control voltage to the first DC voltage generator, the second DC voltage generator and the third DC voltage generator to match the DC voltage passing through the third input buffer to the intermediate voltage of the reference voltages the A/D core generates.

Here, the A/D converter may further comprise a low-pass filter connected to an output terminal of the operational amplifier, for filtering the feedback control voltage.

DETAILED DESCRIPTION OF THE PREFERRED EMBODIMENTS

The invention will now be described with reference to the accompanying drawings.

EMBODIMENT 1

Figure 1:
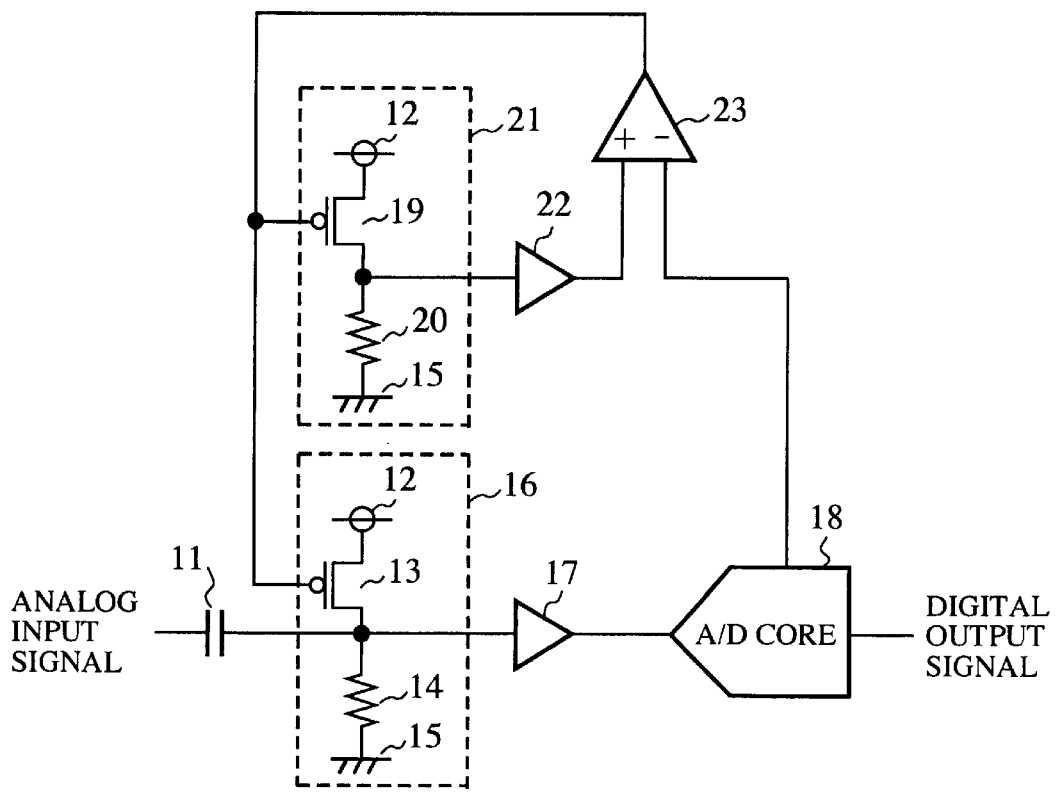
FIG. 1 is a circuit diagram showing a configuration of an embodiment 1 of the A/D converter in accordance with the present invention.

FIG. 1 is a circuit diagram showing a configuration of an embodiment 1 of the A/D converter in accordance with the present invention. In this figure, the reference numeral 11 designates a capacitor connected in series with an analog input signal line, for removing the common voltage (DC component) of the analog input signal.

The reference numeral 12 designates a power supply; 13 designates a PMOS transistor (first conductivity type transistor); 14 designates a resistor; 15 designates a ground; and 16 designates a DC bias circuit (first DC voltage generator) that is composed of a series connection of the foregoing components 12–15, generates a common voltage (DC voltage) controlled in response to a feedback control voltage, and applies the common voltage to the analog input signal passing through the capacitor 11.

The reference numeral 17 designates an input buffer (first input buffer) connected to an analog input signal line passing through the connecting point of the PMOS transistor 13 and resistor 14, for temporarily holding the analog input signal.

The reference numeral 18 designates an A/D core that generates a plurality of reference voltages and the common voltage (intermediate voltage) of the reference voltages, and that converts the analog input signal supplied via the input buffer 17 into a digital output signal on the basis of the reference voltages.

Likewise, the reference numeral 12 designates the power supply; 19 designates a PMOS transistor (first conductivity type transistor); 20 designates a resistor; 15 designates the ground; and 21 designates a DC bias circuit (second DC voltage generator) that is composed of a series connection of the foregoing components 12, 19, 20 and 15, which is controlled in response to the feedback control voltage, and that generates a common voltage (DC voltage), the level of which is the same as that of the common voltage generated by the DC bias circuit 16.

The reference numeral 22 designates an input buffer (second input buffer) that is composed of a replica of the input buffer 17, and connected to the connecting point of the PMOS transistor 19 and resistor 20 in the DC bias circuit 21 to temporarily hold the common voltage generated by the DC bias circuit 21.

The reference numeral 23 designates an operational amplifier having its non-inverting input terminal connected to the output of the input buffer 22 to receive the common voltage fed from the DC bias circuit 21, and its inverting input terminal connected to the common voltage of the reference voltages generated by the A/D core 18. The operational amplifier 23 supplies the feedback control voltage to the gates of the PMOS transistors 13 and 19 of the DC bias circuits 16 and 21, thereby equalizing the two common voltages.

Next, the operation of the present embodiment 1 will be described.

In the case where the reference voltages of the A/D core 18 are set with respect to the ground 15, there are provided as shown in FIG. 1 the DC bias circuits 16 and 21 including the PMOS transistors 13 and 19, respectively. The input buffers 17 and 22 each consist of a simple circuit such as a source follower without the common mode feedback circuit.

It will now be described that the configuration as shown in FIG. 1 can achieve the accurate and fast digital conversion of the analog input signal by matching the common voltage of the analog input signal to be supplied to the A/D core 18 to the common voltage of the reference voltages generated by the A/D core 18.

In FIG. 1, the capacitor 11 connected in series with the analog input signal line removes the common voltage from the analog input signal.

The DC bias circuit 16 causes a DC current, which is controlled in response to the feedback control voltage supplied to the gate of the PMOS transistor 13, to flow from the power supply 12 to the ground 15, thereby generating the common voltage (DC voltage) across the resistor 14 with respect to the potential of the ground 15. Thus, the common voltage is added to the analog input signal passing through the capacitor 11.

The input buffer 17 temporarily holds the analog input signal to which the common voltage is added.

The A/D core 18 generates the plurality of reference voltages, and the common voltage (intermediate voltage) of the reference voltages. The A/D core 18 converts the analog input signal supplied via the input buffer 17 into the digital output signal on the basis of the reference voltages.

The DC bias circuit 21 causes a DC current, which is controlled in response to the feedback control voltage supplied to the gate of the PMOS transistor 19, to flow from the power supply 12 to the ground 15, thereby generating the common voltage (DC voltage) across the resistor 20 with respect to the potential of the ground 15.

The input buffer 22 consists of a replica of the input buffer 17. Here, the replica refers to a circuit composed of transistors arranged in the same layout as that of the original circuit, with achieving similar characteristics. The input buffer 22 temporarily holds the common voltage generated.

The operational amplifier 23, receiving the common voltage via the input buffer 22 and the common voltage of the reference voltages generated by the A/D core 18, supplies the gates of the PMOS transistors 13 and 19 of the DC bias circuits 16 and 21 with the feedback control voltage so that the two common voltages agree with each other.

Thus, the common voltage supplied via the input buffer 22 agrees with the common voltage of the reference voltages generated by the A/D core 18, and hence the common voltage of the analog input signal supplied via the input buffer 17 agrees with the common voltage of the reference voltages generated by the A/D core 18. As a result, the A/D converter of the present embodiment 1 can carry out the accurate fast digital conversion of the analog input signal without providing the input buffer 17 with the common mode feedback circuit.

As described above, the present embodiment 1 is configured such that it controls the common voltages generated by the DC bias circuits 16 and 21 by the feedback control voltage supplied from the operational amplifier 23 so that the common voltage supplied via the input buffer 22 agrees with the common voltage of the reference voltages. Therefore, the present embodiment 1 can match the common voltage of the analog input signal supplied via the input buffer 17 to the common voltage of the reference voltages. Since the actual analog input signal is not supplied to the DC bias circuit 21 and input buffer 22, it is not necessary for the operational amplifier 23 to operate at high speed. As a result, the input buffer 17 can be a simple circuit such as a source follower that can operate at high speed.

In addition, the present embodiment 1 is configured such that the DC currents controlled by the PMOS transistors 13 and 19 flow to the ground 15 through the resistors 14 and 20 to generate the common voltages. Accordingly, when the reference voltages of the A/D core 18 are established with respect to the ground 15, it is possible to control the common voltage applied to the analog input signal at high accuracy.

Furthermore, since the circuit composed of the capacitor 11, resistor 14 and ground 15 constitutes a high-pass filter, it can remove low frequency noise superimposed on the analog input signal.

Although the input buffer 22 comprises the same transistors in size and arrangement as those of the input buffer 17 in the present embodiment 1 to form the replica with the same characteristics, this is not essential. For example, the input buffer 22 can be configured using a replica consisting of transistors with smaller size than those of the input buffer 17 such as $\frac{1}{10}$ or $\frac{1}{20}$ in the dimension. Such input buffer 22 can reduce the current flowing through the transistors by an amount corresponding to the size reduction, thereby reducing the current consumption of the input buffer 22.

EMBODIMENT 2

Figure 2:
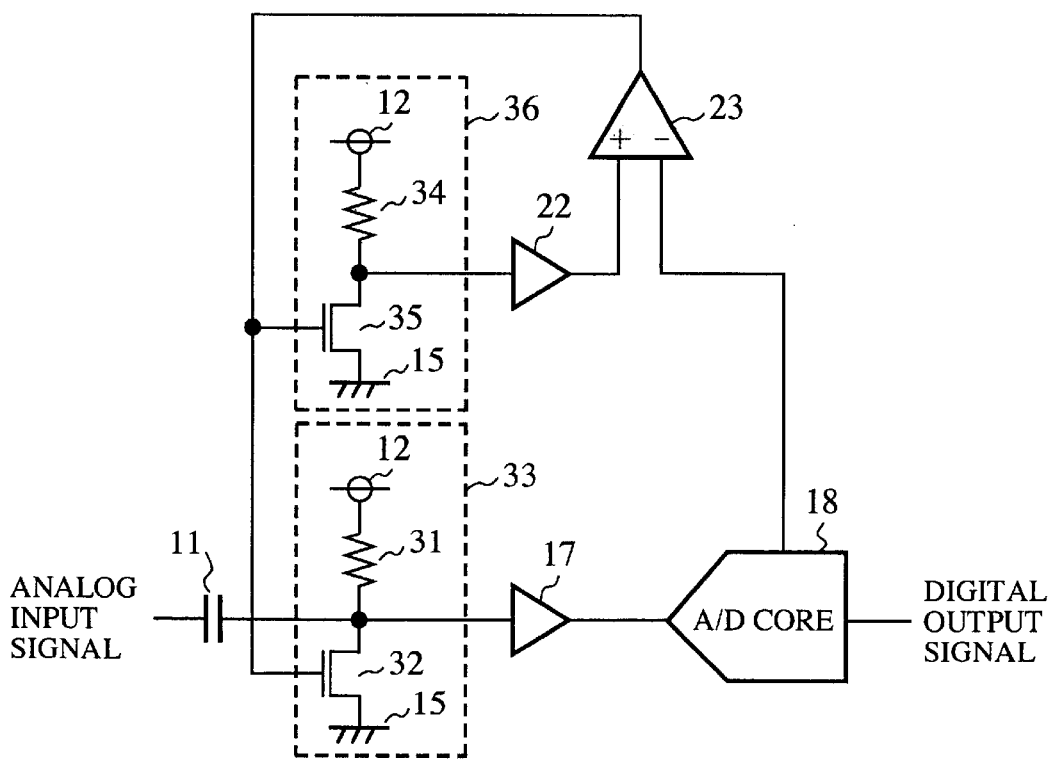
FIG. 2 is a circuit diagram showing a configuration of an embodiment 2 of the A/D converter in accordance with the present invention.

FIG. 2 is a circuit diagram showing a configuration of an embodiment 2 of the A/D converter in accordance with the present invention. In this figure, the reference numeral 12 designates the power supply; 31 designates a resistor; 32 designates an NMOS transistor (second conductivity type transistor); 15 designates the ground; and 33 designates a DC bias circuit (first DC voltage generator) that is composed of a series connection of the foregoing components 12, 31, 32 and 15, generates a common voltage (DC voltage) which is controlled in response to the feedback control voltage, and applies the common voltage to the analog input signal passing through the capacitor 11.

Likewise, the reference numeral 12 designates the power supply; 34 designates a resistor; 35 designates an NMOS transistor (second conductivity type transistor); 15 designates the ground; and 36 designates a DC bias circuit (second DC voltage generator) that is composed of a series connection of the foregoing components 12, 34, 35 and 15, and generates the same common voltage as that of the DC bias circuit 16 under the control in response to the feedback control voltage. The remaining configuration of FIG. 2 is the same as that of FIG. 1.

Next, the operation of the present embodiment 2 will be described.

In the foregoing embodiment 1, the reference voltages of the A/D core 18 are established with respect to the ground 15. Accordingly, the DC bias circuits 16 and 21 employ the PMOS transistors 13 and 19. In contrast with this, in the present embodiment 2, the reference voltages of the A/D core 18 are established with respect to the power supply 12. Thus, the DC bias circuits 33 and 36 employ the NMOS transistors 32 and 35 as shown in FIG. 2.

The DC bias circuit 33 causes the DC current, which is controlled in response to the feedback control voltage supplied to the gate of the NMOS transistor 32, to flow from the power supply 12 to the ground 15. Thus, it generates a common voltage (DC voltage) across the resistor 31 with respect to the power supply 12, and applies the common voltage to the analog input signal passing through the capacitor 11.

Likewise, the DC bias circuit 36 causes the DC current, which is controlled in response to the feedback control voltage supplied to the gate of the NMOS transistor 35, to flow from the power supply 12 to the ground 15. Thus, it generates a common voltage (DC voltage) across the resistor 34 with respect to the power supply 12.

The operational amplifier 23, receiving the common voltage via the input buffer 22 and the common voltage of the reference voltages generated by the A/D core 18, supplies the gates of the NMOS transistors 32 and 35 of the DC bias circuits 33 and 36 with the feedback control voltage so that the two common voltages agree with each other.

As described above, according to the present embodiment 2, it is not necessary for the operational amplifier 23 to operate at high speed as in the foregoing embodiment 1. As a result, the input buffer 17 can be a simple circuit such as a source follower that can operate at high speed.

In addition, the present embodiment 2 is configured such that the DC currents controlled by the NMOS transistors 32 and 35 flow to the ground 15 through the resistors 31 and 34 to generate the common voltages. Accordingly, when the reference voltages of the A/D core 18 are established with respect to the power supply 12, it is possible to control the common voltage applied to the analog input signal at high accuracy.

EMBODIMENT 3

Figure 3:
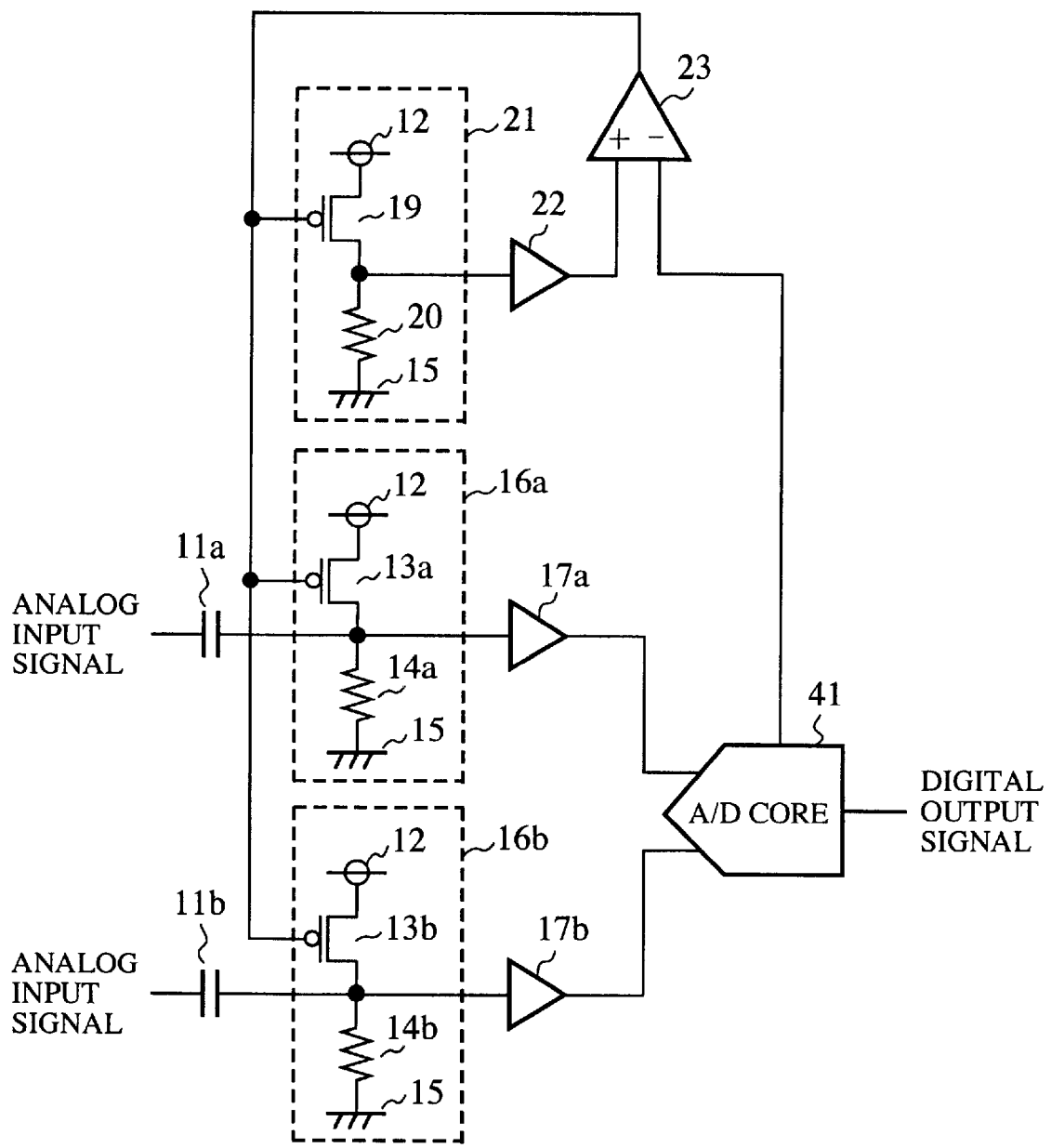
FIG. 3 is a circuit diagram showing a configuration of an embodiment 3 of the A/D converter in accordance with the present invention.

FIG. 3 is a circuit diagram showing a configuration of an embodiment 3 of the A/D converter in accordance with the present invention. In this figure, reference numerals 11a and 11b each designate a capacitor (first capacitor or second capacitor) connected in series with one of differential analog input signal lines, for removing the common voltage (DC component) of the analog input signal.

The reference numeral 12 designates the power supply; 13a designates a PMOS transistor (first conductivity type transistor); 14a designates a resistor; 15 designates the ground; and 16a designates a DC bias circuit (first DC voltage generator) that is composed of a series connection of the foregoing components, generates a common voltage (DC voltage) controlled in response to a feedback control voltage, and applies the common voltage to the analog input signal passing through the capacitor 11a.

The reference numeral 17a designates an input buffer (first input buffer) connected to an analog input signal line passing through the connecting point of the PMOS transistor 13a and resistor 14a, for temporarily holding the analog input signal.

Likewise, the reference numeral 12 designates the power supply; 13b designates a PMOS transistor (first conductivity type transistor); 14b designates a resistor; 15 designates the ground; and 16b designates a DC bias circuit (second DC voltage generator) that is composed of a series connection of the foregoing components, generates a common voltage (DC voltage) controlled in response to a feedback control voltage, and applies the common voltage to the analog input signal passing through the capacitor 11b.

The reference numeral 17b designates an input buffer (second input buffer) connected to an analog input signal line passing through the connecting point of the PMOS transistor 13b and resistor 14b, for temporarily holding the analog input signal.

The reference numeral 41 designates an A/D core that generates a plurality of reference voltages and the common voltage (intermediate voltage) of the reference voltages, and that converts the differential input of the analog input signal supplied via the input buffers 17a and 17b into a digital output signal on the basis of the reference voltages.

Furthermore, the reference numeral 12 designates the power supply; 19 designates a PMOS transistor; 20 designates a resistor; 15 designates a ground; and 21 designates a DC bias circuit (third DC voltage generator) that is composed of a series connection of the foregoing components, which is controlled in response to the feedback control voltage, and that generates a common voltage (DC voltage), the level of which is the same as that of the common voltages generated by the DC bias circuits 16a and 16b.

The reference numeral 22 designates an input buffer (third input buffer) that is composed of a replica of the input buffers 17a and 17b, and connected to the connecting point of the PMOS transistor 19 and resistor 20 in the DC bias circuit 21 to temporarily hold the common voltage generated by the DC bias circuit 21.

The reference numeral 23 designates the operational amplifier having its non-inverting input terminal supplied with the common voltage via the input buffer 22, and its inverting input terminal supplied with the common voltage of the reference voltages generated by the A/D core 41. The operational amplifier 23 supplies the feedback control voltage to the gates of the PMOS transistors 13a, 13b and 19 of the DC bias circuits 16a, 16b and 21, thereby equalizing the common voltages.

Next, the operation of the present embodiment 3 will be described.

The present embodiment 3 is an example that applies the foregoing embodiment 1 to the differential input A/D converter.

In FIG. 3, the capacitors 11a and 11b remove the common voltages from the differential analog input signals. The DC bias circuits 16a and 16b generate the common voltages in response to the feedback control voltage, and apply them to the analog input signals supplied through the capacitors 11a and 11b. The input buffers 17a and 17b temporarily hold the analog input signals to which the common voltages are added. The A/D core 41 converts the differential analog input signals supplied via the input buffers 17a and 17b into the digital output signal on the basis of the reference voltages.

The DC bias circuit 21 generates the common voltage in response to the feedback control voltage, and the input buffer 22 temporarily holds the common voltage generated.

The operational amplifier 23, receiving the common voltage via the input buffer 22 and the common voltage of the reference voltages generated by the A/D core 41, supplies the gates of the PMOS transistors 13a, 13b and 19 of the DC bias circuits 16a, 16b and 21 with the feedback control voltage so that the common voltages agree with each other.

As described above, the present embodiment 3 is configured such that it controls the common voltages generated by the DC bias circuits 16a, 16b and 21 in response to the feedback control voltage supplied from the operational amplifier 23 so that the common voltage of the reference voltages agrees with the common voltage supplied via the input buffer 21. Therefore, the present embodiment 3 can match the common voltages of the analog input signal supplied via the input buffers 17a and 17b to the common voltage of the reference voltages. Since the actual analog input signal is not supplied to the DC bias circuit 21 and input buffer 22, it is not necessary for the operational amplifier 23 to operate at high speed. As a result, the input buffers 17a and 17b can be a simple circuit such as a source follower that can operate at high speed.

In addition, the present embodiment 3 is applicable to the differential A/D converter.

EMBODIMENT 4

Figure 4:
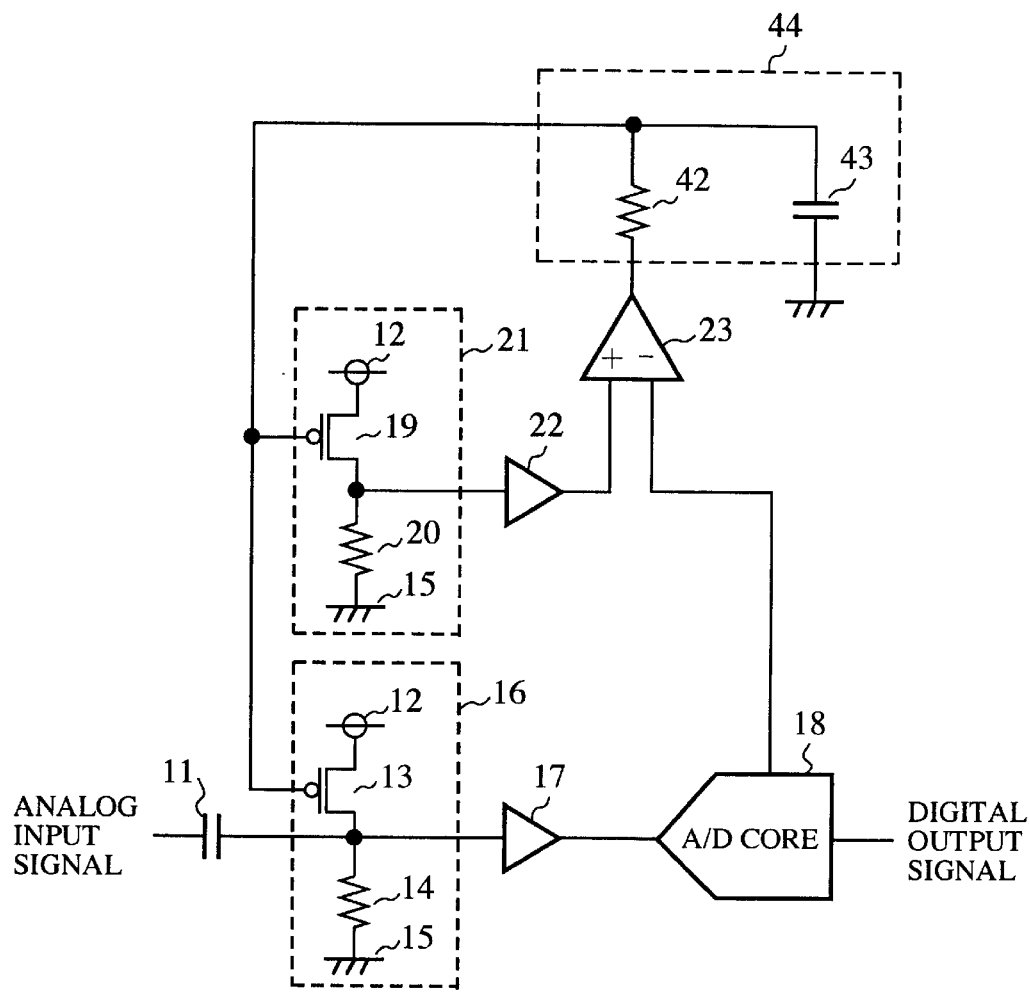
FIG. 4 is a circuit diagram showing a configuration of an embodiment 4 of the A/D converter in accordance with the present invention.
Figure 5:
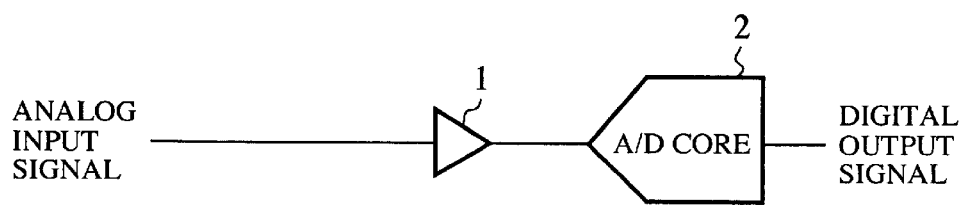
FIG. 5 is a circuit diagram showing a configuration of a conventional A/D converter.

FIG. 4 is a circuit diagram showing a configuration of an embodiment 4 of the A/D converter in accordance with the present invention. In this figure, the reference numeral 44 designates a low-pass filter connected to the output of the operational amplifier 23 to filter the feedback control voltage. The low-pass filter 44 comprises a resistor 42 and a capacitor 43. The remaining configuration is the same as that of FIG. 1.

Next, the operation of the present embodiment 4 will be described.

The reference voltages of the A/D core 18 operating at high speed may be unstable because of the clock signal and the like. In such a case, the common voltage of the reference voltages is also unstable. As a result, the feedback control voltage the operational amplifier 23 outputs can include high frequency noise superimposed thereon.

In view of this, the present embodiment 4 comprises the low-pass filter connected to the output of the operational amplifier 23. It can eliminate the high frequency noise, and prevents the PMOS transistors 13 and 19 in the DC bias circuits 16 and 21 from being affected by the noise. As a result, the DC bias circuits 16 and 21 can generate stable common voltages.

As described above, the present embodiment 4 comprises the low-pass filter 44 connected to the output of the operational amplifier 23 to filter the feedback control voltage. Thus, even if the common voltage of the reference voltages of the A/D core 18 operating at the high speed is unstable, the present embodiment 4 can eliminate the high frequency noise superimposed on the feedback control voltage output from the operational amplifier 23. Therefore, the DC bias circuits 16 and 21 can generate stable common voltages.

Although the low-pass filter 44 is added to the configuration of the foregoing embodiment 1 in the present embodiment 4, it can be added to the configuration of the foregoing embodiment 3, offering the same effect.

What is claimed is:

1. An A/D converter comprising:
   a capacitor for removing a DC component of an analog input signal;
   a first DC voltage generator for generating a DC voltage controlled in response to a feedback control voltage, and for applying the DC voltage to the analog input signal passing through said capacitor;
   a first input buffer for temporarily holding the analog input signal passing through said first DC voltage generator;
   an A/D core that generates a plurality of reference voltages and an intermediate voltage of the reference voltages, and that converts the analog input signal passing through said first input buffer into a digital output signal on the basis of the reference voltages;
   a second DC voltage generator for generating, in response to the feedback control voltage, a same DC voltage as the DC voltage said first DC voltage generator generates;
   a second input buffer consisting of a replica of said first input buffer, for temporarily holding the DC voltage said second DC voltage generator generates; and
   an operational amplifier for supplying the feedback control voltage to said first DC voltage generator and said second DC voltage generator to match the DC voltage passing through said second input buffer to the intermediate voltage of the reference voltages said A/D core generates.

2. The A/D converter according to claim 1, wherein said first DC voltage generator comprises a first conductivity type transistor and a resistor, which are connected in series between a power supply and a ground, and said first input buffer is connected to a connecting point of said first conductivity type transistor and said resistor;
   wherein said second DC voltage generator comprises a first conductivity type transistor and a resistor, which are connected in series between the power supply and the ground, and said second input buffer is connected to a connecting point of said first conductivity type transistor and said resistor; and wherein said first conductivity type transistors have their gates supplied with the feedback control voltage.

3. The A/D converter according to claim 1, wherein said first DC voltage generator comprises a resistor and a second conductivity type transistor, which are connected in series between a power supply and a ground, and said first input buffer is connected to a connecting point of said resistor and said second conductivity type transistor; wherein said second DC voltage generator comprises a resistor and a second conductivity type transistor, which are connected in series between the power supply and the ground, and said second input buffer is connected to a connecting point of said resistor and said second conductivity type transistor; and wherein said second conductivity type transistors have their gates supplied with the feedback control voltage.

4. The A/D converter according to claim 1, wherein said second input buffer consists of a downsized replica of said first input buffer.

5. An A/D converter comprising:
   a first capacitor for removing a DC component of a first analog input signal;
   a first DC voltage generator for generating a DC voltage controlled in response to a feedback control voltage, and for applying the DC voltage to the first analog input signal passing through said first capacitor;
   a first input buffer for temporarily holding the first analog input signal passing through said first DC voltage generator;
   a second capacitor for removing a DC component of a second analog input signal;
   a second DC voltage generator for generating a DC voltage controlled in response to a feedback control voltage, and for applying the DC voltage to the second analog input signal passing through said second capacitor;
   a second input buffer for temporarily holding the second analog input signal passing through said second DC voltage generator;
   an A/D core that generates a plurality of reference voltages and an intermediate voltage of the reference voltages, and that converts a differential input between the first analog input signal passing through said first input buffer and the second analog input signal passing through said second input buffer into a digital output signal on the basis of the reference voltages;
   a third DC voltage generator for generating, in response to the feedback control voltage, a same DC voltage as the DC voltages said first DC voltage generator and said second DC voltage generator generate;
   a third input buffer consisting of a replica of said first input buffer and said second input buffer, for temporarily holding the DC voltage said third DC voltage generator generates; and
   an operational amplifier for supplying the feedback control voltage to said first DC voltage generator, said second DC voltage generator and said third DC voltage generator to match the DC voltage passing through said third input buffer to the intermediate voltage of the reference voltages said A/D core generates.

6. The A/D converter according to claim 1, further comprising a low-pass filter connected to an output terminal of said operational amplifier, for filtering the feedback control voltage.

7. The A/D converter according to claim 5, further comprising a low-pass filter connected to an output terminal of said operational amplifier, for filtering the feedback control voltage.

* * * * *